US009705507B1

(12) United States Patent
Jain

(10) Patent No.: US 9,705,507 B1
(45) Date of Patent: Jul. 11, 2017

(54) FIXED FREQUENCY DIVIDER CIRCUIT

(71) Applicant: Texas Instruments Incorporated, Dallas, TX (US)

(72) Inventor: Dinesh Jain, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/158,622

(22) Filed: May 19, 2016

(51) Int. Cl.

| | |
|---|---|
| ***H03K 21/00*** | (2006.01) |
| ***H03K 21/02*** | (2006.01) |
| ***H03K 5/05*** | (2006.01) |
| ***H03K 23/58*** | (2006.01) |

(52) U.S. Cl.
CPC ............. *H03K 21/026* (2013.01); *H03K 5/05* (2013.01); *H03K 23/58* (2013.01)

(58) Field of Classification Search
CPC .................................................... H03K 21/026
See application file for complete search history.

(56) References Cited

U.S. PATENT DOCUMENTS

| | | | |
|---|---|---|---|
| 7,289,592 B2 | 10/2007 | Lee | |
| 8,299,827 B2 | 10/2012 | Subburaj et al. | |
| 9,257,991 B2 | 2/2016 | Pace | |
| 2004/0017233 A1 | 1/2004 | Wood | |
| 2005/0058236 A1 | 3/2005 | Ke | |
| 2006/0055440 A1 * | 3/2006 | Tseng ...................... | H03L 7/085 327/158 |
| 2007/0146021 A1 | 6/2007 | Stikvoort et al. | |
| 2008/0042699 A1 | 2/2008 | Narathong et al. | |
| 2008/0043893 A1 | 2/2008 | Nagaraj et al. | |
| 2010/0046693 A1 | 2/2010 | Ellersick | |
| 2010/0102877 A1 | 4/2010 | Welland et al. | |
| 2015/0207510 A1 | 7/2015 | Pace | |

* cited by examiner

*Primary Examiner* — Daniel Puentes
(74) *Attorney, Agent, or Firm* — Ronald O. Neerings; Charles A. Brill; Frank D. Cimino

(57) ABSTRACT

Disclosed examples include frequency divider circuits to divide a high frequency first clock signal to generate an output clock signal at a lower frequency, including a delay circuit to provide a delayed clock signal, a divider circuit to provide a divided clock signal, a sub-sampling circuit to sub-sample the first clock signal with the divided clock signal, and a feedback circuit to set the delay value of the adjustable delay circuit according to the sub-sampled output signal.

19 Claims, 5 Drawing Sheets

FIXED FREQUENCY DIVIDER CIRCUIT

BACKGROUND

RF synthesizers are used to provide clock signals to one or more system circuits based on a high frequency master clock signal from a voltage controlled oscillator (VCO) or other clock source. Fixed frequency dividers or channel dividers are used to divide the VCO output signal to generate lower frequency clock signals. New applications demand higher clock speeds where the VCO input frequency can exceed 10 GHz. In addition, many RF synthesizer applications require low noise operation, particularly low far-off phase noise performance of the frequency divider circuit following the VCO. In conventional designs, fixed frequency divider circuitry is a primary contributor to far-off phase noise, and extending operation to higher VCO input frequencies worsens phase errors, particularly for large division ratios needed to support both high and low frequency circuits in a given system. The divider circuit can be segmented into multiple cascaded divider stages, but timing specifications become critical when operating with a higher frequency input clock signals, such as 10 GHz. To meet stringent timing requirements, intervening resampling latches or flip-flops can be added to resample the divided clock signals with the input clock signal. However, the extra resampling flip-flops consume additional power. Thus, operating conventional divider circuits at increased input frequencies generally increases far-off phase noise and also leads to increased power consumption.

SUMMARY

Disclosed examples include frequency divider circuits and methods to divide a high frequency first clock signal to generate a lower frequency output clock signal. An input clock signal is buffered and a delay circuit provides a delayed clock signal based on the buffer output signal. A divider circuit provides a divided clock signal based on the delayed clock signal, and an output circuit generates an output signal based on the buffered input signal and the divided clock signal. A sub-sampling circuit sub-samples the buffer output signal with the divided clock signal, and a feedback circuit sets the delay value of the delay circuit according to the sub-sampled output signal to reduce phase errors between edges of the divided clock signal and edges of the first clock signal or of the buffered clock signal. In certain examples, the divider circuit includes a ripple counter with individual fixed divider circuits, and a multiplexer circuit to provide the divided clock signal according to the output of a selected one of the fixed divider circuits to reduce power consumption and further reduce delay times and improve phase noise.

DETAILED DESCRIPTION

Figure 1:
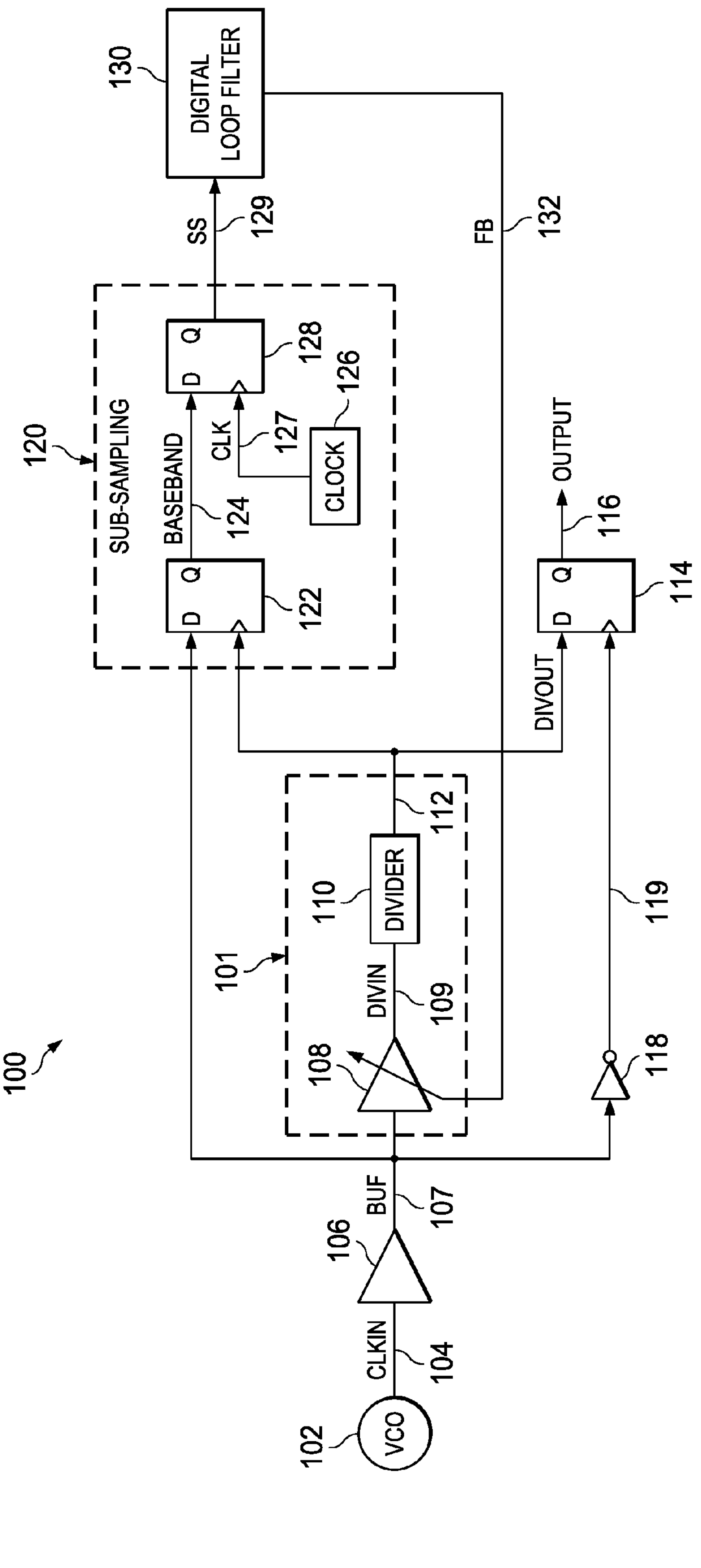
FIG. 1 is a schematic diagram of a clock circuit with an adjustable delay circuit regulated by sub-sampling feedback.

In the drawings, like reference numerals refer to like elements throughout, and the various features are not necessarily drawn to scale. In the following discussion and in the claims, the terms “including”, “includes”, “having”, “has”, “with”, or variants thereof are intended to be inclusive in a manner similar to the term “comprising”, and thus should be interpreted to mean “including, but not limited to . . . ”

FIG. 1 shows a clock circuit 100 that receives a high frequency input clock signal CLKIN from the output of a voltage-controlled oscillator (VCO) 102. The clock circuit 100 provides a low frequency output signal OUTPUT for use by one or more further circuits (not shown). The circuit 100 includes an input isolation buffer with an input 104 to receive the clock signal CLKIN, and an output 107 of the buffer 106 provides a buffered clock signal BUF at the frequency of the input clock signal CLKIN. The clock circuit 100 can be implemented in an integrated circuit (IC) having terminals, such as pins or pads, for electrical connection to external circuits. For example, an IC implementation of the clock circuit 100 can receive the input signal CLKIN from an external VCO or other clock source through a conductive pin or pad connection to deliver the input clock signal CLKIN to the isolation buffer circuit 106. Moreover, the IC can include one or more output pads or pins to deliver the output signal OUTPUT to an external circuit (not shown). An IC implementation can also include one or more power pads or pins and configuration input pads or pins (not shown) to provide selection control signals to configure a divider circuit 110 as detailed further below in connection with FIG. 2.

The clock circuit 100 further includes a first circuit 101 with an adjustable delay circuit 108 and a divider circuit 110. An output flip-flop circuit 114 generates the output clock signal OUTPUT at a second frequency less than the first frequency of the input clock signal CLKIN. The adjustable delay circuit 108 includes an input coupled with the buffer output 107 to receive the buffered clock signal BUF. The delay circuit 108 includes a control input 132 to receive a control signal FB. The delay circuit 108 also includes an output 109 that provides a delayed clock signal DIVIN at the first frequency. The delayed clock signal DIVIN is delayed by a delay value relative to the buffered clock signal BUF. The delay value is set by the received control signal FB. In the illustrated example, the adjustable delay circuit 108 operates according to an analog control signal FB, and adjusts the delay value generally proportional to the amplitude of the signal FB. In this example, longer delay times are provided by the circuit 108 for higher amplitude control signals FB, and shorter delay times are provided for lower amplitude control signals FB. In another example, the control signal FB can be a single bit or multibit digital signal, and the circuit 108 implements a delay time corresponding to the digital signal FB. In one example, the delay circuit 108 provides a delay time value in an adjustment range of about one cycle or period of the received input clock signal CLKIN, and is adjustable in a closed phase regulation loop according to the control signal FB to facilitate adjustment of the relative phases of the divided clock signal DIVOUT and the original input signal CLKIN.

The divider circuit 110 in one example is a fixed asynchronous divider which includes an input to receive the delayed clock signal DIVIN. The divider circuit 110 divides the clock signal DIVIN and provides to create a divided clock signal DIVOUT at an output 112. The divided clock signal DIVOUT has a second frequency that is less than the first frequency of the delayed clock signal DIVIN. In some examples, the divider circuit 110 is implemented using ripple counters with a configurable multiplexer circuit to provide a selectable divided output frequency as a fraction of the frequency of the first clock signal CLKIN, such as ½, ¼, . . . $\frac{1}{2}^N$, where N is a positive integer. Further details of an example divider circuit 110 are illustrated and described below in connection with FIG. 2.

The output flip-flop 114 resamples the divided clock signal DIVOUT in according to the buffered clock signal BUF. The output flip-flop 114 includes a first input, in this example a data input (D), coupled with the output 112 of the divider circuit 110 to receive the divided clock signal DIVOUT from the output 112 of the divider circuit 110. A second flip-flop input, in this case an enable or clock or control input, is coupled to directly or indirectly receive the buffered clock signal BUF. In the example of FIG. 1, the BUF signal is provided to sample the input (D) of the flip-flop 114 through an inverter 118. The inverter 118 in the example of FIG. 1 includes an input connected to the buffer circuit output 107. The inverter 118 includes an output 119 that provides an inverted input clock signal to sample the input (D) of the flip-flop 114 based on the buffered input clock signal BUF. The resampling or output flip-flop 114 also includes a data output 116 providing the clock circuit output signal OUTPUT clock signal for further use by other circuits (not shown). In this example, the flip-flop 114 aligns the positive edges of the output signal OUTPUT with the phase of negative or low-going clock edges of the high frequency buffered clock signal BUF.

The clock circuit 100 also includes a sub-sampling circuit 120 and a feedback circuit 130. In operation, these circuits provide feedback to generate the control signal FB to adjust the value of the delay time of the adjustable delay circuit 108 to reduce phase errors between edges of the divided clock signal DIVOUT and edges of the high frequency signal BUF. In the example of FIG. 1, the sub-sampling circuit 120 includes a first input coupled with the buffer input 107 to receive the buffered input clock signal BUF, and a second input coupled to the divider circuit output 112 to receive the divided clock signal DIVOUT. The sub-sampling circuit 120 also includes an output 129 to provide a sub-sampled output signal SS representing sub-sampling of the buffered clock signal BUF with the divided clock signal DIVOUT. The sub-sampled output signal SS is received by an input of the feedback circuit 130. The feedback circuit 130 includes an output 132 to provide the control signal FB to the control input of the adjustable delay circuit 108 to set the delay value according to the sub-sampled output signal SS. In one example, the feedback circuit 130 can be a buffer or inverter to provide a digital feedback signal FB as the control input to a digital control input of the adjustable delay circuit 108. The delay circuit 108 in this example sets the delay time value according to the received digital control signal FB.

In the example of FIG. 1, the adjustable delay circuit 108 operates according to an analog control signal FB. The feedback circuit 130 in this example is a digital filter or loop filter that provides an analog signal FB according to the sub-sampled output signal SS from the sub-sampling circuit 120. The sub-sampling circuit 120 in FIG. 1 includes a D flip-flop 122 with a first (e.g., data) input coupled with the output 107 of the buffer 106, and a second (e.g., enable or clock) input coupled to receive the divided clock signal DIVOUT from the output 112 of the divider circuit 110. The flip-flop 122 in this case sub-samples the buffered clock signal BUF with the lower frequency divided clock signal DIVOUT, and provides a baseband signal BASEBAND to an output 124. A further D flip-flop 128 includes a first input (e.g., data input) coupled to the first flip-flop output 124 to receive the baseband signal, a second input coupled to the output 127 of a clock circuit 126 to receive a sampling clock signal CLK. The output 129 of the flip-flop 128 provides the sub-sampled output signal SS to the feedback circuit 130. The sampling clock signal CLK has a frequency less than the frequency of the divided clock signal DIVOUT, for example, 10 kHz to 200 MHz. In this example, the feedback filter circuit 130 provides a low pass filter function to generate an analog control signal FB for setting the delay time of the adjustable delay circuit 108. The low pass filter of the feedback circuit 130 in this example has a cutoff frequency below the frequency of the sampling clock signal CLK.

The flip-flop 122 provides the BASEBAND signal 124 having a first Boolean state (e.g., LO) when the positive edge of the divided clock signal DIVOUT precedes a positive edge of the buffered clock signal BUF, and a second Boolean state (e.g., HI) when the positive edge of the buffered clock signal BUF precedes the positive edge of the divided clock signal DIVOUT. The second flip-flop 128 in the example of FIG. 1 provides the sub-sampled output signal SS in a first state indicating that a positive edge of the divided clock signal DIVOUT precedes a positive edge of the buffered clock signal BUF. The circuit 120 provides the signal SS in a second state indicating that the positive edge of the buffered clock signal BUF precedes the positive edge of the divided clock signal DIVOUT. The data input (D) of the flip-flop 122 receives the signal BUF at a higher frequency than the clock signal DIVOUT, and the baseband signal at the output 124 this represents a Boolean condition indicating whether the buffered clock signal BUF is high or low when the flip-flop 122 is clocked by an edge of the divided clock signal DIVOUT. The feedback filter circuit 130 in this example filters the sub-sampled output signal SS and provides the control signal FB as an analog signal with an amplitude representing the proportion of time that the positive edge of the divided clock signal DIVOUT precedes the positive edge of the buffered clock signal BUF.

The adjustable delay circuit 108 regulates the delay value according to the amplitude of the control signal FB to reduce phase errors between the positive edges of the divided clock signal DIVOUT and the positive edges of the buffered clock signal BUF. In other examples, one or more inverter circuits can be included in the clock circuit 100 to cause the sub-sampling circuit 120, the feedback circuit 130 and the adjustable delay circuit 108 to regulate phase error relative to negative edges of the clock signals DIVOUT and BUF. In other examples, the buffer circuit 106 can be omitted, and the clock circuit 100 operates directly according to the received input clock signal CLKIN. In this manner, phase errors are reduced by operation of the circuit 100, and the circuits 120, 130 and 108 operate in a closed loop fashion to regulate and preferably mitigate or eliminate phase errors. Strict phase locking conditions are not required, although possible using the clock circuit 100. Moreover, strict frequency locking conditions are not required, although possible. Although D flip-flops 114, 122 and 128 are used in the example of FIG. 1, other flip-flop types can be used in different examples. In addition, although the illustrated sub-sampling circuit 120 includes flip-flops 122 and 128, and a sampling clock 126, other sub-sampling circuits 120 can be used which provide a sub-sampled output signal SS with first and second states respectively indicating leading or lagging edge relationships between the signals DIVOUT and BUF. In one example, the flip-flops 114, 122, 128 are constructed using current mode logic circuits.

Figure 2:
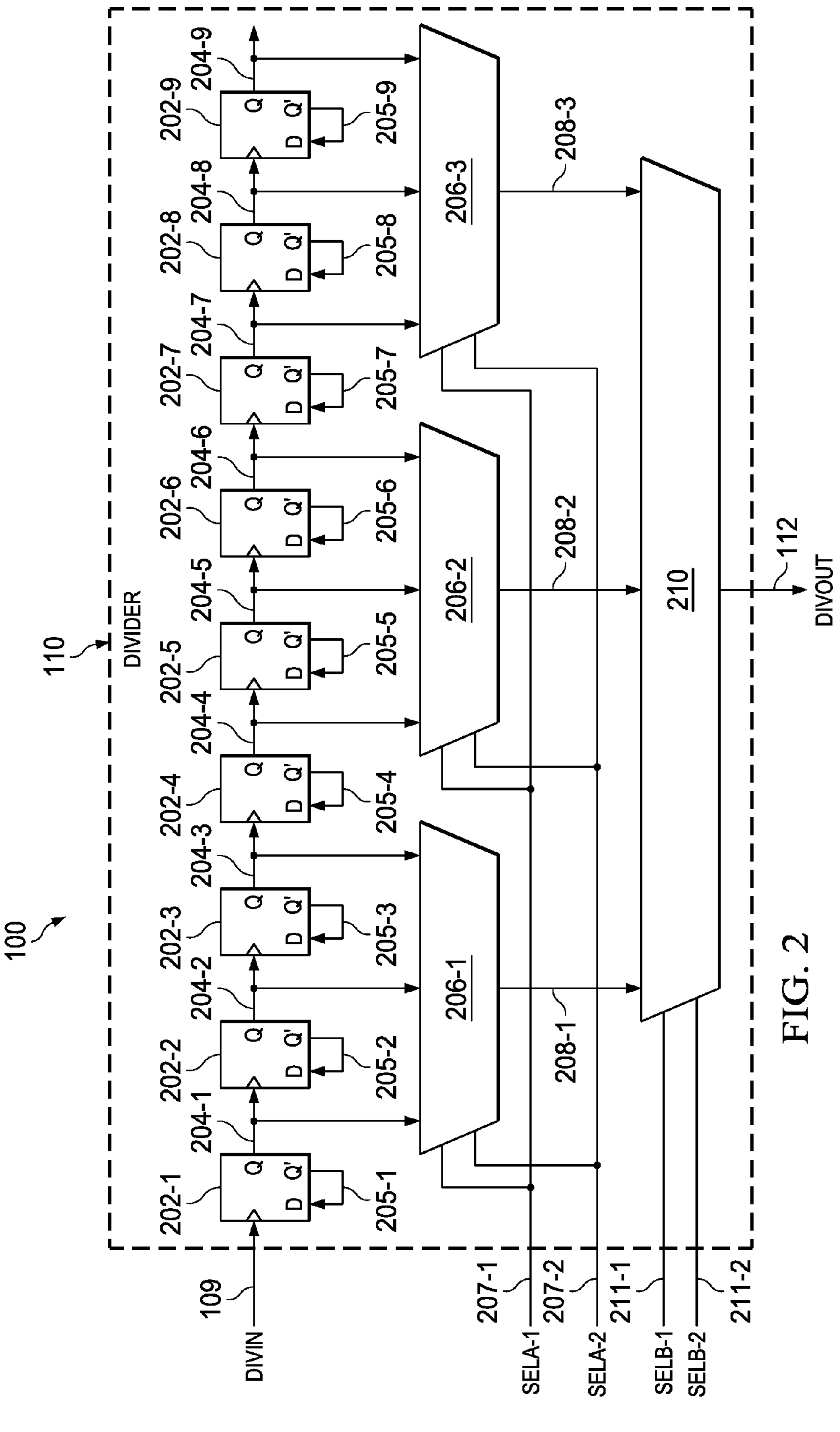
FIG. 2 is a schematic diagram of a divider circuit including a ripple divider and a multiplexer circuit.

FIG. 2 shows an example divider circuit 110 that can be used in the clock circuit 100 of FIG. 1. The divider circuit 110 in FIG. 2 includes a ripple counter divider circuit formed by a cascade circuit including latches or flip-flops 202, as well as a multiplexer circuit 206, 210. In the illustrated example, the ripple counter circuit includes nine D flip-flops 202-1, 202-2, . . . , 202-9 providing a cascade connection of fixed divider circuits, each dividing by a factor of 2. In other possible examples, different division factors can be used for individual ones of the fixed divider circuits 202, such as divided by 2, 4, 8, etc. In certain examples, different types of flip-flops can be used, such as J-K or S-R flip-flops for the fixed divider circuits 202. In certain examples, the flip-flops of the fixed divider circuits 202 are constructed using current mode logic.

Each flip-flop 202 in the example of FIG. 2 provides an output clock signal at a frequency lower than the clock signal received at its input. In this example, moreover, the individual flip-flops 202 include an input (e.g., an enable or clock input) that receives an input clock signal at an input frequency, and a non-inverted data output 204 (Q) (e.g., 204-1, 204-2, . . . 204-9) that provides an output clock signal at an output frequency less than the input frequency. The first flip-flop 202-1 in this case receives the divided clock signal DIVIN from the output 112 of the divider circuit 110 in FIG. 1. The data inputs (D) of the individual ripple counter flip-flops 202 are connected to receive the inverted data output (Q') of the corresponding flip-flop 202 via connections 205-1, 205-2, . . . 205-9). By this connection, each individual flip-flop stage 202 divides its input signal frequency by a factor of 2. The cascade connection of the flip-flops 202-1 through 202-9 in the illustrated example allows the multiplexer circuit 206, 210 to selectively provide the divided output signal DIVOUT at a binary-weighted division ratio of 2-512. In other examples, any suitable integer number of fixed divider circuits 202 can be used.

The multiplexer circuit 206, 210 includes a plurality of signal inputs to receive the divided clock output signals from the corresponding flip-flop data outputs 204-1, 204-2, . . . 204-9. In this example, two levels of multiplexers 206 and 210 are provided, although a single multiplexer stage can be used in other examples. The multiplexer circuit 210 in this case provides the divided clock signal DIVOUT to the output 112 of the divider circuit 110 according to a selected one of the outputs 204 of the fixed divider circuits 202, and the particular divided clock signal is selected according to select control signals SELA-1, SELA-2, SELB-1 and SELB-2 received on input lines 207-1, 207-2, 211-1 and 211-2. In the two-level example of FIG. 2, the signals SELA-1 and SELA-2 allow selection of one of three flip-flop data outputs 204 by each of three first-level multiplexers 206-1, 206-2 and 206-3. These multiplexers 206 provide three outputs 208-1, 208-2 and 208-3 as inputs to a second-level multiplexer 210 and are selectable according to the select signals SELB-1 and SELB-2. The select signals SEL in one example are programmable or configurable by a user or by circuit connection. In one example, the clock circuit 100 is implemented in an IC, and the input lines 207-1, 207-2, 211-1 and 211-2 are connected to IC pins or pads to allow external selection of the desired divided clock output signal 205 delivered at the final multiplexer output 212 as the output signal OUTPUT.

The example divider circuit 110 in FIG. 2 facilitates low phase noise operation by limiting the divider circuit delays from the buffer circuit output 107 to the divided clock output 112 to the accumulated delays associated with the ripple counter dividers 202 and the multiplexers 206 and 210. This allows operation at high input frequencies, such as 10 GHz, with the divider circuit delay being less than one clock cycle in certain examples. The output flip-flop 114 resamples the divided clock signal DIVOUT with the inverted buffered clock BUF (FIG. 1) or with a delayed high speed clock signal CLKINDELAY (FIG. 4 below) to reduce phase noise of the divider circuit 110 itself. In addition, the clock circuit 100 uses feedback to further control low far-off phase noise and promote phase locking by operation of the circuits 120 to sub-sample the high frequency input or buffered clock signal CLKIN or BUF with the divided clock signal DIVOUT to generate feedback control signaling FB to adjust the delay circuit 108. The clock circuit 100 also provides low power operation at high input frequencies, as the divider circuit 110 only uses a single output flip-flop 114 for resampling the divided clock signal DIVOUT with the negative edge of the buffered high speed clock signal BUF. In the ripple counter circuit example of FIG. 2, the power consumption of the divider flip-flops 202 decreases from left to right. This facilitates low power operation while still providing significant division ratios (e.g., 2-2048 in some examples), since intermediate resampling between cascaded divider stages is not needed to meet stringent timing specifications of high input frequency systems.

Figure 3:
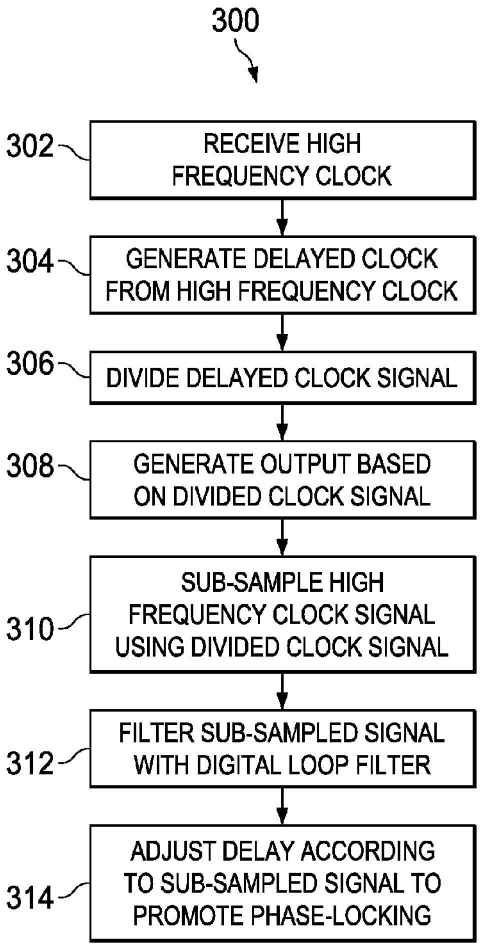
FIG. 3 is a flow diagram of a method for dividing a high frequency clock.

FIG. 3 shows a process or method 300 for dividing a clock signal, which can be implemented in any suitable clock circuitry, such as the above clock circuit 100 to divide the received input clock signal CLKIN, or the buffered clock signal BUF. The method 300 includes receiving a first clock signal at a first frequency at 302 (e.g., CLKIN or BUF in FIG. 1), and generating a delayed clock signal (e.g., at the first frequency) according to the first clock signal using a delay circuit (e.g., circuit 108 above). The method 300 further includes dividing the delayed clock signal at 306 to provide a divided clock signal (e.g., DIVOUT) at a second frequency less than the first frequency using a divider circuit. Any suitable divider circuit can be used at 306, such as the divider circuit 110 in FIGS. 1 and 2 above). In certain examples, the method 300 further includes generating an output signal at 308 at the second frequency according to the first clock signal BUF using a flip-flop 114 clocked by the first clock signal (e.g., OUTPUT signal generated using the flip-flop 114 in FIG. 1). Continuing at 310, the method 300 also includes sub-sampling the first clock signal (e.g., BUF) with the divided clock signal (e.g., DIVOUT) to generate a sub-sampled output signal SS, and filtering the sub-sampled output signal SS at 312 to generate an analog feedback signal (e.g., using the circuit 130 above to provide the analog control signal FB). In one example, the analog feedback signal has an amplitude representing a proportion of time that an edge of the divided clock signal DIVOUT precedes an edge of the first clock signal. At 314, a delay time of the delay circuit is adjusted according to the sub-sampled output signal (e.g., SS).

Figure 4:
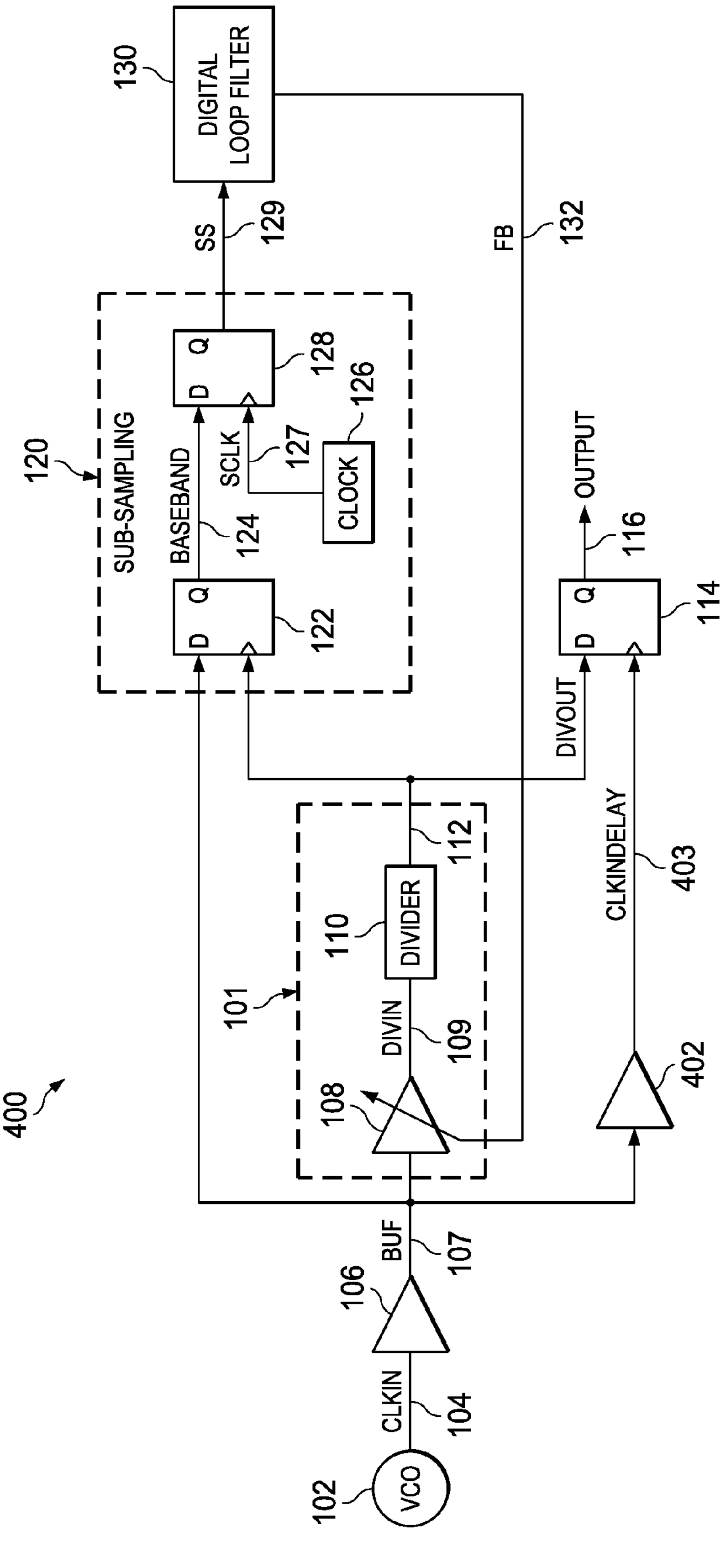
FIG. 4 is a schematic diagram of another example clock circuit.

FIG. 4 shows another example clock circuit 400, including an input isolation buffer 106, an adjustable delay circuit 108, a divider circuit 110, an output flip-flop 114, as well as a sub-sampling circuit 120 and a feedback circuit 130 as generally described above. Unlike the circuit 100 of FIG. 1, a fixed delay circuit 402 is connected between the output 107 of the buffer 106 and the second input of the output flip-flop 114. The input of the fixed delay circuit 402 is connected to receive the BUF signal from the buffer output 107. An output 403 of the fixed delay circuit 402 provides a clock signal CLKINDELAY to the enable input of the flip-flop 114 to align the edges of the divided (e.g., low frequency) output clock signal OUTPUT with edges of the buffered clock signal BUF in generating the final circuit output signal OUTPUT.

Figure 5:
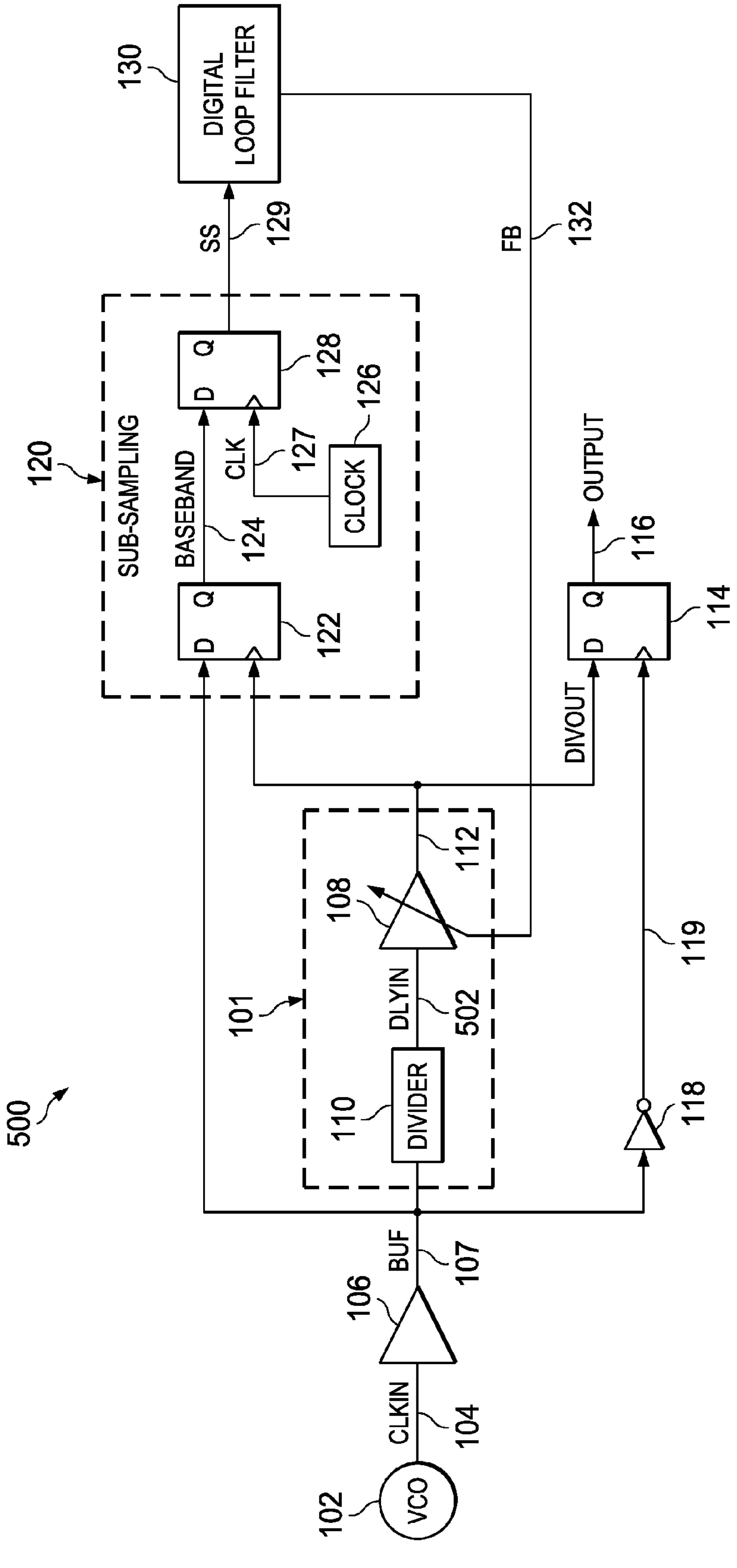
FIG. 5 is a schematic diagram of another clock circuit example with an adjustable delay circuit regulated by sub-sampling feedback.

FIG. 5 shows another clock circuit example 500 with a divider circuit 110 and an adjustable delay circuit 108 regulated by sub-sampling feedback from a sub-sampling circuit 120. The circuit 500 includes a buffer circuit 106, a sub-sampling circuit 120, a digital loop filter feedback circuit 130 providing an analog or digital feedback signal FB, an output flip-flop 114 and an inverter 118 as described above in connection with FIG. 1. A first circuit 101 in this example includes a divider circuit 110 and an adjustable delay circuit 108. Unlike the examples of FIGS. 1 and 4, the input of the divider circuit 110 in FIG. 5 receives the buffered clock signal BUF from the buffer output 107, and the divider output 502 provides a delay input clock signal DLYIN at the second frequency. The input of the adjustable delay circuit 108 receives the delay input clock signal DLYIN. The adjustable delay circuit 108 provides the divided clock signal DIVOUT at the second frequency, delayed by the delay value relative to the delay input clock signal DLYIN. The adjustment functions and other operation of the circuit 500 are otherwise as described above. In an alternate embodiment, the inverter 118 can be replaced with a delay 402 as shown in FIG. 4 above.

Figure 6:
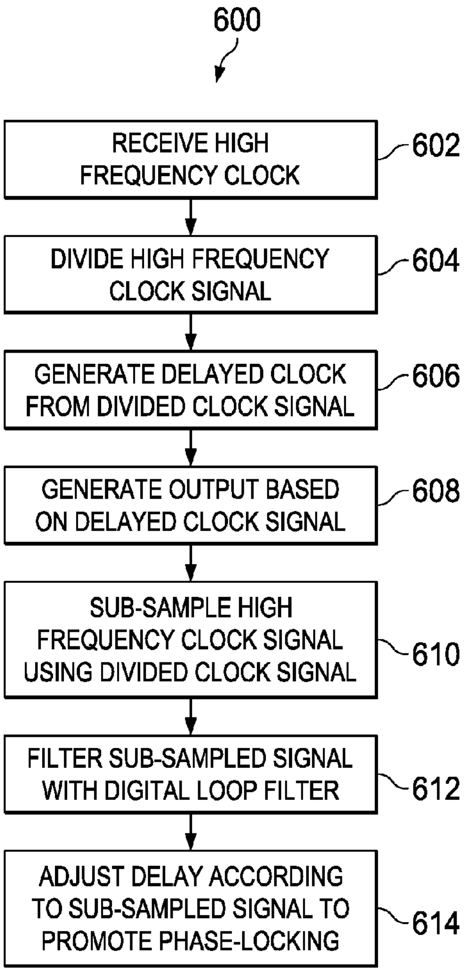
FIG. 6 is a flow diagram of another method for dividing a high-frequency clock.

FIG. 6 shows a method 600 for dividing a high-frequency clock. The method 600 includes receiving a first clock signal at a first frequency at 602 (e.g., high frequency clock signal CLKIN or BUF in FIG. 5). At 604, the high frequency first clock signal is divided to provide a signal at a second frequency, for example, using the divider circuit 110 in FIG. 5. At 606, the divided or lower frequency signal is delayed using a delay circuit (e.g., circuit 108 in FIG. 5. This generates a delayed clock signal at the lower second frequency. The method 600 further includes generating an output signal at 608 at the second frequency according to the first clock signal BUF (e.g., OUTPUT signal generated using the flip-flop 114 in FIG. 1). At 610, the first clock signal (e.g., BUF) is sub-sampled with the divided clock signal (e.g., DIVOUT) to generate the sub-sampled output signal SS. The sub-sampled output signal SS is filtered at 612 to generate a feedback signal FB (e.g., using the circuit 130 in FIG. 5), where the feedback signal can be analog or digital and represents the proportion of time that an edge of the divided clock signal DIVOUT precedes an edge of the first clock signal. At 614, the delay time of the delay circuit is adjusted according to the sub-sampled output signal, for example, via the feedback signal FB.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A clock circuit, comprising:

a buffer, including an input to receive a first clock signal having a first frequency, and an output to provide a buffered clock signal at the first frequency;

a first circuit, including:

an input coupled to receive the buffered clock signal from the output of buffer, an output to provide a divided clock signal at a second frequency less than the first frequency, an adjustable delay circuit and a divider circuit connected with one another between the input and the output of the first circuit, the adjustable delay circuit including an input coupled to receive a delay input signal, an output to provide a delayed clock signal, the delayed clock signal being delayed by a delay value relative to the delay input signal, and a control input to receive a control signal to set the delay value, and the divider circuit including an input coupled to receive a clock signal at the first frequency, and an output to provide a clock signal at a second frequency less than the first frequency;

a first flip-flop, including a first input coupled to receive the divided clock signal from the output of the first circuit, a second input to receive the buffered clock signal, and an output to provide an output signal at the second frequency;

a sub-sampling circuit, including a first input coupled with the output of the buffer to receive the buffered clock signal, a second input coupled to receive the divided clock signal from the output of the first circuit, and an output to provide a sub-sampled output signal representing sub-sampling of the buffered clock signal with the divided clock signal; and a feedback circuit, including an input to receive the sub-sampled output signal from the output of the sub-sampling circuit, and an output to provide the control signal to the control input to set the delay value of the adjustable delay circuit according to the sub-sampled output signal.

2. The clock circuit of claim 1, wherein the output of the sub-sampling circuit provides the sub-sampled output signal in a first state indicating that a positive edge of the divided clock signal precedes a positive edge of the buffered clock signal, and a second state indicating that the positive edge of the buffered clock signal precedes the positive edge of the divided clock signal; and wherein the feedback circuit includes a digital filter circuit to filter the sub-sampled output signal and to provide the control signal as an analog signal with an amplitude representing a proportion of time that the positive edge of the divided clock signal precedes the positive edge of the buffered clock signal.

3. The clock circuit of claim 2, wherein the adjustable delay circuit regulates the delay value according to the amplitude of the control signal to reduce phase errors between the positive edges of the divided clock signal and the positive edges of the buffered clock signal.

4. The clock circuit of claim 2, wherein the sub-sampling circuit includes:

a second flip-flop, including a first input coupled with the output of the buffer to receive the buffered clock signal, a second input coupled to receive the divided clock signal from the output of the first circuit, and an output to provide a baseband signal;

a third flip-flop, including a first input coupled to receive the baseband signal from the output of the second flip-flop, a second input, and an output to provide the sub-sampled output signal; and a clock, including an output coupled to provide a sampling clock signal to the second input of the third flip-flop at a third frequency less than the second frequency.

5. The clock circuit of claim 4, wherein the first, second and third flip-flops are D flip-flops;

wherein the first inputs of the individual first, second and third flip-flops are data inputs; and wherein the second inputs of e individual first, second and third flip-flops are enable inputs.

6. The clock circuit of claim 1, wherein the adjustable delay circuit regulates the delay value according to the control signal to reduce phase errors between edges of the divided clock signal and edges of the buffered clock signal.

7. The clock circuit of claim 1, further comprising a fixed delay circuit, including an input coupled with the output of the buffer to receive the buffered clock signal, and an output coupled with the second input of the first flip-flop.

8. The clock circuit of claim 1, further comprising an inverter, including an input connected to the output of the buffer to receive the buffered clock signal, and an output coupled with the second input of the first flip-flop.

9. The clock circuit of claim 1, wherein the divider circuit includes:

a plurality of fixed divider circuits connected in a cascade circuit, the fixed divider circuits individually including an input to receive an input clock signal at an input frequency, and an output to provide an output clock signal at an output frequency less than the input frequency, the plurality of fixed divider circuits including:

a first fixed divider circuit including an input coupled with the output of the adjustable delay circuit to receive the delayed clock signal, and an output to provide a first output clock signal to a subsequent fixed divider circuit at a first output frequency less than the first frequency, and a second fixed divider circuit including an input coupled with the output of the first fixed divider circuit, and an output to provide a second output clock signal at a second output frequency less than the first output frequency; and a multiplexer circuit, including a plurality of signal inputs individually connected to one of the outputs of the fixed divider circuits, and an output to provide the divided clock signal to the output of the divider circuit according to a selected one of the outputs of the fixed divider circuits.

10. The clock circuit of claim 9, wherein the divider circuit includes a ripple counter circuit formed by the plurality of fixed divider circuits.

11. The clock circuit of claim 10, wherein the individual fixed divider circuits are D flip-flops including:

an enable input to receive one of the delayed clock signal and the output clock signal from a preceding D flip-flop;

a data output to provide the output clock signal to a subsequent D flip-flop;

an inverted data output to provide an inverted output clock signal; and a data input coupled to the inverted data output to receive the inverted output clock signal.

12. The clock circuit of claim 1, wherein the input of the adjustable delay circuit receives the buffered clock signal from the output of the buffer, the output of the adjustable delay circuit provides the delayed clock signal at the first frequency, the delayed clock signal being delayed by the delay value relative to the buffered clock signal; and wherein the input of the divider circuit receives the delayed clock signal from the output of the adjustable delay circuit, and the output of the divider circuit provides the divided clock signal.

13. The clock circuit of claim 1, wherein the input of the divider circuit receives the buffered clock signal from the output of the buffer, and the output of the divider circuit provides a delay input clock signal at the second frequency; and wherein the input of the adjustable delay circuit receives the delay input clock signal from the output of the divider circuit, and the output of the adjustable delay circuit provides the divided clock signal at the second frequency, the divided clock signal being delayed by the delay value relative to the delay input clock signal.

14. A clock circuit, comprising:

a buffer to receive a first clock signal having a first frequency, and to provide a buffered clock signal at the first frequency;

an adjustable delay circuit to provide a delayed clock signal, the delayed clock signal being delayed by a delay value relative to the buffered clock signal;

a ripple counter circuit to receive the delayed clock signal, the ripple counter circuit including a plurality of fixed divider circuits connected in a cascade circuit, the fixed divider circuits individually including an input to receive an input clock signal at an input frequency, and an output to provide an output clock signal at an output frequency less than the input frequency;

a multiplexer circuit, including a plurality of signal inputs individually connected to one of the outputs of the fixed divider circuits, and an output to provide a divided clock signal at a second frequency less than the first frequency according to a selected one of the outputs of the fixed divider circuits;

a first flip-flop, including a first input coupled to receive the divided clock signal, a second input to receive the buffered clock signal, and an output to provide an output signal at the second frequency;

a sub-sampling circuit to provide a sub-sampled output signal representing sub-sampling of the buffered clock signal with the divided clock signal; and a feedback circuit to set the delay value of the adjustable delay circuit according to the sub-sampled output signal.

15. The clock circuit of claim 14, wherein the individual fixed divider circuits are D flip-flops including:

an enable input to receive one of the delayed clock signal and the output clock signal from a preceding D flip-flop;

a data output to provide the output clock signal to a subsequent D flip-flop;

an inverted data output to provide an inverted output clock signal; and a data input coupled to the inverted data output to receive the inverted output clock signal.

16. The clock circuit of claim 14, wherein feedback circuit regulates the delay value to reduce phase errors between edges of the divided clock signal and edges of the buffered clock signal.

17. A method to divide a clock signal, comprising:

receiving a first clock signal having a first frequency;

generating a delayed clock signal according to the first clock signal using a delay circuit;

dividing the first clock signal or the delayed clock signal to provide a divided clock signal at a second frequency less than the first frequency using a fixed divider circuit;

sub-sampling the first clock signal with the divided clock signal to generate a sub-sampled output signal;

adjusting a delay time of the delay circuit according to the sub-sampled output signal; and filtering the sub-sampled output signal to generate an analog feedback signal with an amplitude representing a proportion of time that an edge of the divided clock signal precedes an edge of the first clock signal; and adjusting the delay time of the delay circuit according to the amplitude of the feedback signal to reduce phase errors between edges of the divided clock signal and edges of the first clock signal.

18. The method of claim 17, further comprising:

generating an output signal at the second frequency according to the first clock signal using a flip-flop clocked by the first clock signal.

19. The method of claim 17, comprising:

generating the delayed clock signal at the first frequency according to the first clock signal using the delay circuit; and dividing the delayed clock signal to provide the divided clock signal at the second frequency using the fixed divider circuit.

* * * * *